(12) United States Patent
Shimizu et al.

(10) Patent No.: US 11,443,952 B2
(45) Date of Patent: Sep. 13, 2022

(54) ETCHING METHOD AND ETCHING DEVICE

(71) Applicant: TOKYO ELECTRON LIMITED, Tokyo (JP)

(72) Inventors: Akitaka Shimizu, Nirasaki (JP); Shuichiro Uda, Miyagi (JP); Takeshi Saito, Nirasaki (JP); Taiki Kato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 16/627,449

(22) PCT Filed: May 11, 2018

(86) PCT No.: PCT/JP2018/018364
§ 371 (c)(1),
(2) Date: Dec. 30, 2019

(87) PCT Pub. No.: WO2019/003663
PCT Pub. Date: Jan. 3, 2019

(65) Prior Publication Data
US 2021/0151326 A1 May 20, 2021

(30) Foreign Application Priority Data
Jun. 30, 2017 (JP) ............................. JP2017-128222

(51) Int. Cl.
*H01L 21/311* (2006.01)
*H01J 37/32* (2006.01)
*H01L 21/67* (2006.01)

(52) U.S. Cl.
CPC .. *H01L 21/31116* (2013.01); *H01J 37/32449* (2013.01); *H01L 21/67069* (2013.01); *H01J 2237/3346* (2013.01)

(58) Field of Classification Search
CPC .......... H01L 21/31116; H01L 21/67069; H01J 37/32449; H01J 2237/3346
See application file for complete search history.

(56) References Cited

U.S. PATENT DOCUMENTS

| 5,874,013 A | 2/1999 | Tokunaga et al. |
| 2008/0179292 A1 | 7/2008 | Nishimura et al. |
| 2013/0023125 A1 | 1/2013 | Singh |
| 2013/0052827 A1* | 2/2013 | Wang ............... H01L 21/31116 438/694 |
| 2013/0130507 A1 | 5/2013 | Wang et al. |

(Continued)

FOREIGN PATENT DOCUMENTS

| JP | 7335612 A | 12/1995 |
| JP | 2008187105 A | 8/2008 |

(Continued)

*Primary Examiner* — Binh X Tran
(74) *Attorney, Agent, or Firm* — Nath, Goldberg & Meyer; Jerald L. Meyer; Tanya E. Harkins

(57) ABSTRACT

A method of selectively etching a silicon nitride film includes a first step of disposing a target substrate having the silicon nitride film formed thereon in a processing space, a second step of introducing a gas containing H and F into the processing space, and a third step of selectively introducing radicals of an inert gas into the processing space.

19 Claims, 8 Drawing Sheets

(56) References Cited

U.S. PATENT DOCUMENTS

| | | | | |
|---|---|---|---|---|
| 2015/0206774 A1* | 7/2015 | Singh | ............... | H01J 37/32899 |
| | | | | 156/345.35 |
| 2015/0214474 A1* | 7/2015 | Nishimura | .............. | H01L 43/08 |
| | | | | 438/3 |
| 2015/0371865 A1* | 12/2015 | Chen | ................... | H01J 37/3244 |
| | | | | 438/715 |
| 2016/0225637 A1 | 8/2016 | Takahashi et al. | | |
| 2016/0247690 A1 | 8/2016 | Takahashi et al. | | |

FOREIGN PATENT DOCUMENTS

| | | | |
|---|---|---|---|
| JP | 2014522104 A | 8/2014 | |
| JP | 201573035 A | 4/2015 | |
| JP | 201579877 A | 4/2015 | |
| JP | 2016143781 A | 8/2016 | |
| JP | 2017-85161 A | 5/2017 | |
| KR | 10-2014-0024316 A | 2/2014 | |
| KR | 10-2016-0030822 A | 3/2016 | |
| KR | 10-2016-0095617 A | 8/2016 | |

* cited by examiner

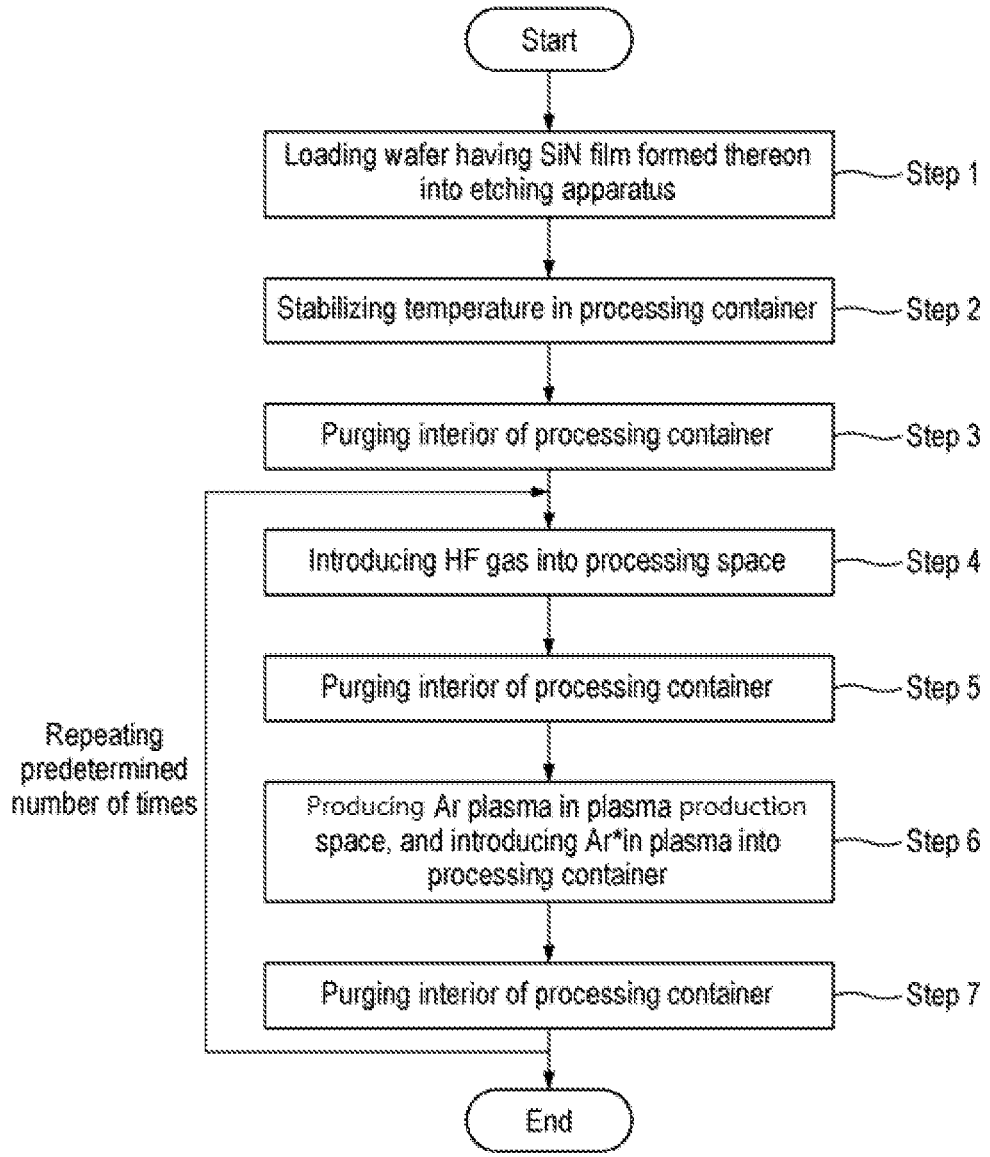

ETCHING METHOD AND ETCHING DEVICE

TECHNICAL FIELD

The present disclosure relates to an etching method of etching a silicon nitride (SiN) film, and an apparatus therefor.

BACKGROUND

In recent years, fine etching has been performed during a manufacturing process of semiconductor devices. For example, various etching techniques for etching a SiN film have been examined.

In the etching of the SiN film, when the SiN film coexists with (is adjacent to) another film such as a $SiO_2$ film, high selectivity is required for the other film. To meet such a requirement, Patent Document 1 discloses a technique for etching a SiN film with respect to a thermal oxide film with high selectivity by heating a substrate to 60 degrees C. or higher and supplying a HF gas to the substrate. In addition, Patent Document 2 discloses a technique for etching a SiN film with respect to a $SiO_2$ film with high selectivity by supplying a HF gas, a $F_2$ gas, an inert gas, and an $O_2$ gas which are in an excited state, into a chamber.

PRIOR ART DOCUMENT

Patent Documents

Patent Document 1: Japanese Laid-Open Patent Publication No. 2008-187105
Patent Document 2: Japanese Laid-Open Patent Publication No. 2015-73035

SUMMARY

The present disclosure provides a technique capable of selectively etching a silicon nitride (SiN) film without using a dedicated apparatus and without causing a surface oxidation.

An etching method according to an embodiment of the present disclosure is a method of selectively etching a silicon nitride film, and includes a first step of disposing a target substrate having the silicon nitride film formed thereon in a processing space, a second step of introducing a gas containing H and F into the processing space, and a third step of selectively introducing radicals of an inert gas into the processing space.

According to the present disclosure, it is possible to provide a technique capable of selectively etching a silicon nitride (SiN) film without using a dedicated apparatus and without causing a surface oxidation.

BRIEF DESCRIPTION OF DRAWINGS

FIG. 7 is a flowchart illustrating an example of SiN film etching method according to an embodiment of the present disclosure.

DETAILED DESCRIPTION

Hereinafter, an embodiment will be described in detail with reference to the drawings.

<Outline of Etching of SiN Film>

First, an outline of chemical etching of a SiN film in this embodiment will be described. In the etching of the SiN film, a fluorine-based gas such as HF is effective as an etching gas. The etching is enabled by generating SiNF in a reaction with the etching gas. However, in a case of using a HF gas alone, a high pressure is required as in Patent Document 1. In addition, in the case of adding an $O_2$ gas in order to increase the selectivity with respect to a $SiO_2$ film as disclosed in Patent Document 2, there is a concern about surface oxidation.

Therefore, a method of etching the SiN film using the HF gas without causing such a problem has been examined.

Figure 1:
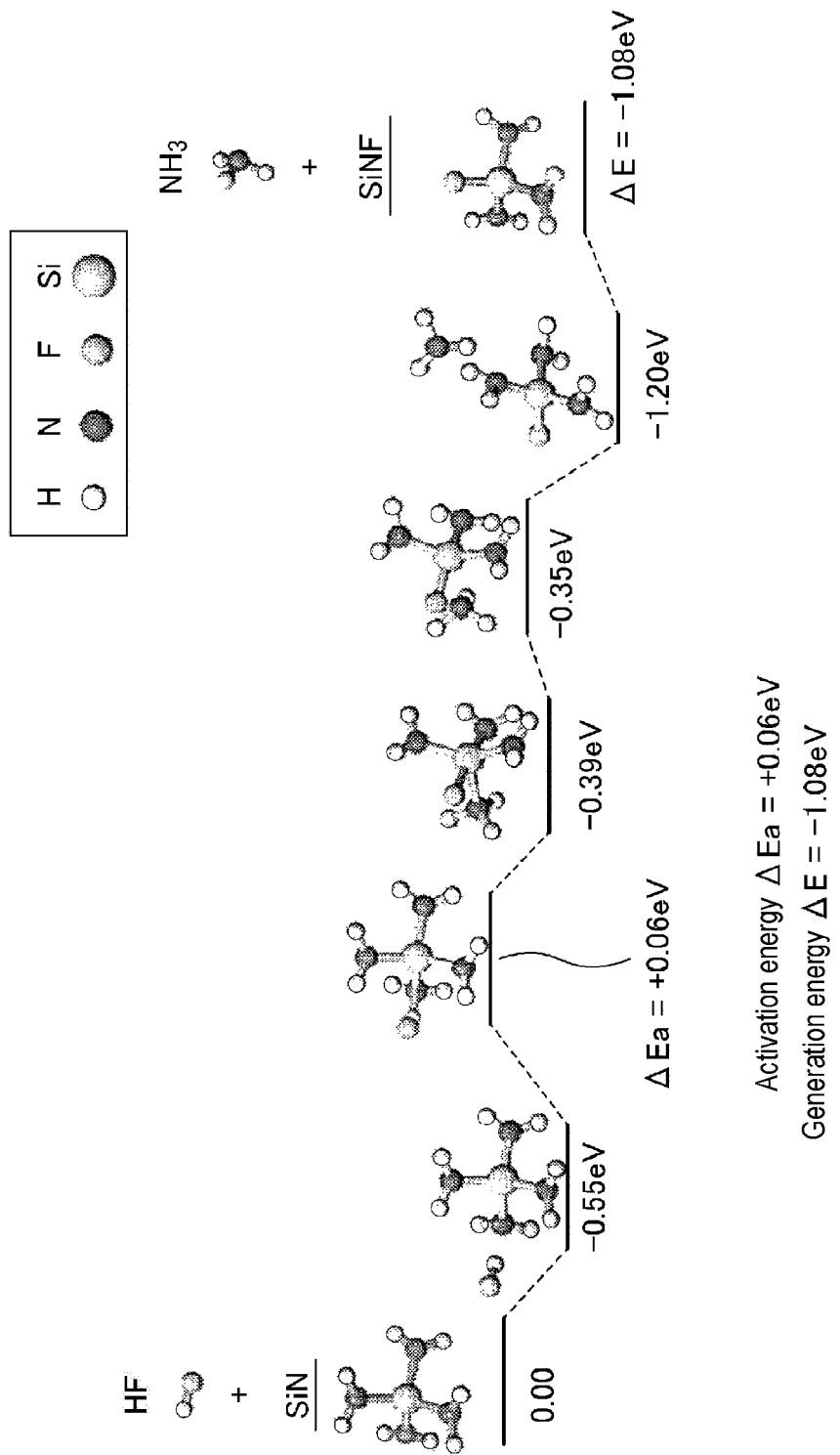
FIG. 1 is a diagram showing a result of obtaining potential energy at each reaction stage in a reaction process of etching a SiN film with HF by simulation.

First, simulation results of a potential energy of an active complex that is rate-limited in a SiN+HF reaction will be described. FIG. 1 shows the result of obtaining the potential energy of each reaction stage in an etching reaction process, under the assumption that the energy when the SiN film and the HF gas exist independently is 0 eV. As shown in FIG. 1, it can be seen that a generation energy $\Delta E$ from the state of SiN+HF to the state of $SiNF+NH_3$ is −1.08 eV, and an activation energy $\Delta E_a$ of the reaction is +0.06 eV.

From this, it is considered that the etching reaction of the SiN film proceeds without using a high-pressure condition as in Patent Document 1 by applying the energy of +0.06 eV or greater, which is the value of the activation energy $\Delta E_a$, after the HF gas is adsorbed to the SiN film.

In order to cause the etching reaction to proceed chemically without damaging the film, it is effective to apply energy using radicals of an inert gas (noble gas) such as Ar radicals that have high energy and cause little damage.

Figure 2:
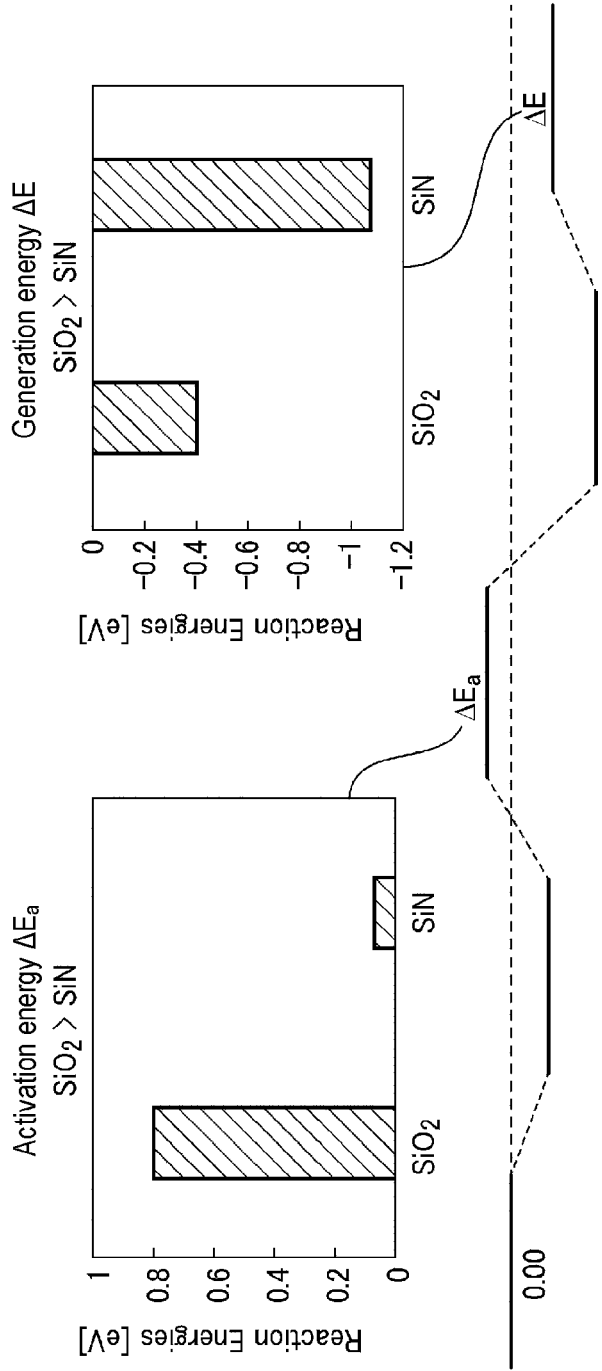
FIG. 2 is a diagram showing a comparison between activation energy $\Delta E_a$ and generation energy $\Delta E$ in a reaction process of etching a SiN film with HF and a reaction process of etching a $SiO_2$ film with HF, by simulation.

Meanwhile, for a thermal oxide film ($SiO_2$), a simulation was performed similarly on the potential energy of an active complex that is rate-limited in $SiO_2$+HF, from the potential energy of each reaction stage in an etching reaction process. FIG. 2 shows the simulation result of $SiO_2$ compared with the simulation result of SiN. As shown in FIG. 2, the activation energy $\Delta E_a$ in the $SiO_2$+HF reaction is +0.8 eV, which is substantially larger than +0.06 eV in the SiN+HF reaction. The generation energy ΔE in the SiO$_2$+HF reaction is also −0.4 eV, which is larger than −1.08 eV in the SiN+HF reaction. That is, it can be seen that since the SiO$_2$ film is less likely to be etched with the HF gas, it is possible to etch the SiN film with respect to the SiO$_2$ film with high selectivity. Similarly, it has also been found that, since other films that may coexist with the SiN film, such as a Si film, a SiGe film, a W film, a TiN film, and a TaN film are less likely to be etched with the HF gas, it is possible to etch the SiN film with respect to these films with high selectivity.

Therefore, in this embodiment, the SiN film is etched by executing a step of introducing a gas containing H and F, such as a HF gas, into a processing space in which a target substrate having a SiN film formed thereon is disposed, and a step of selectively introducing radicals of an inert gas into the processing space. By repeating these steps a predetermined number of times, it is possible to adjust an etched depth (amount). At this time, since an O$_2$ gas is not included as an etching gas, the surface oxidation of the SiN film and other films is suppressed. In addition, by applying energy through the radiation of the radicals of the inert gas, it is possible to perform the etching without using a dedicated apparatus under a high-pressure condition, and to etch the SiN film with respect to other films with high selectivity.

Details thereof will be described below.

[Example of Processing System used for SiN Film Etching]

Figure 3:
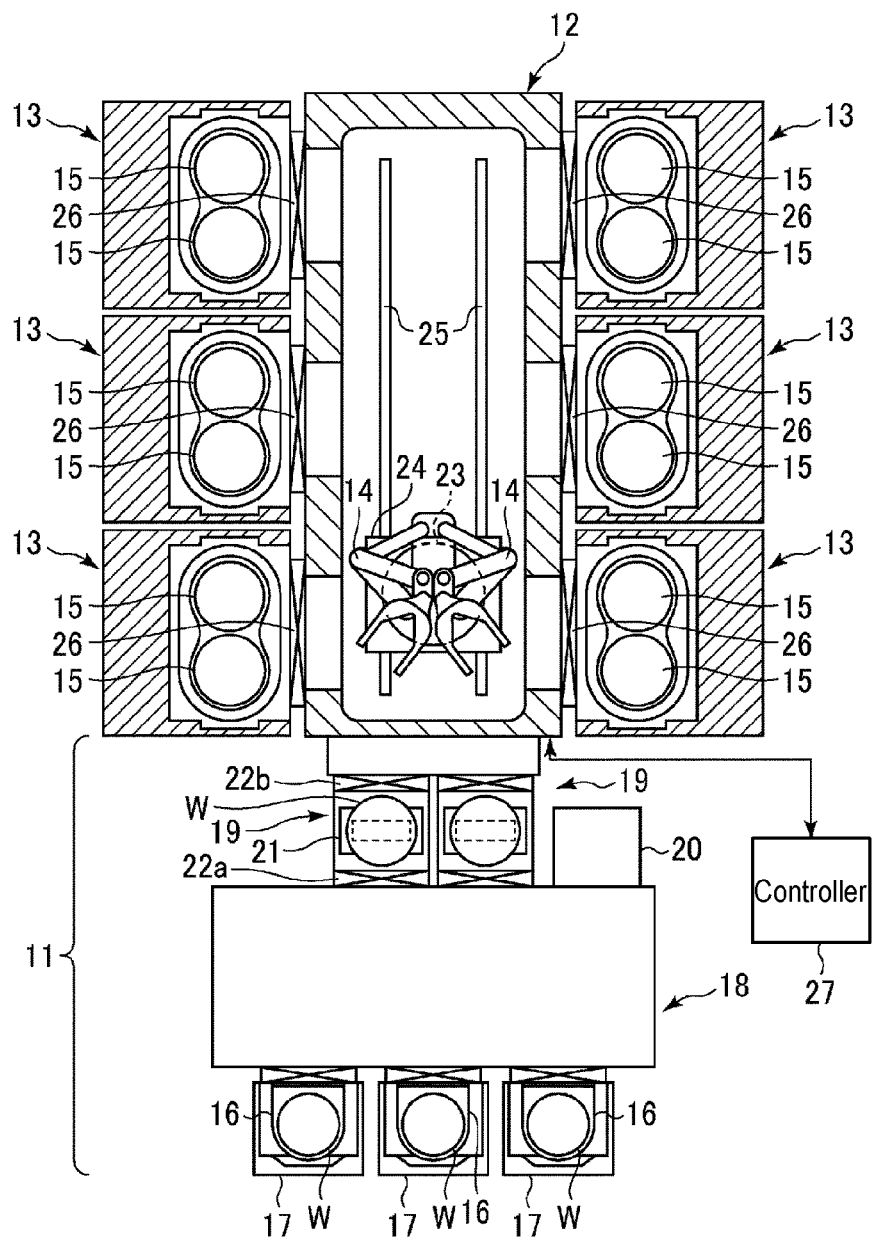
FIG. 3 is a partial cross-sectional plan view schematically illustrating an example of a processing system used for etching the SiN film.

First, an example of the processing system used in etching the SiN film will be described. FIG. 3 is a partial cross-sectional plan view schematically illustrating an example of the processing system used for a SiN film etching method according to an embodiment.

As illustrated in FIG. 3, a processing system 10 includes a loading/unloading part 11, a transfer module 12, and a plurality of process modules 13. The loading/unloading part 11 stores a plurality of wafers W and performs loading/unloading of the wafers W. The transfer module 12 is a transfer chamber in which two wafers W are simultaneously transferred. The process module 13 performs a SiN film etching process and a heating process on the wafers W loaded from the transfer module 12. The interiors of each process module 13 and the transfer module 12 are maintained in a vacuum atmosphere.

In the processing system 10, the wafers W stored in the loading/unloading part 11 are transferred by transfer arms 14 built in the transfer module 12. The wafers W are respectively mounted on two stages 15 arranged inside each process module 13 by the transfer arms 14. Subsequently, in each process module 13 of the processing system 10, the SiN film etching process and the heating process are performed on each of the wafers W placed on the stages 15. Thereafter, the processed wafers W are transferred to the loading/unloading part 11 by the transfer arms 14.

The loading/unloading part 11 includes load ports 17, a loader module 18, two load-lock modules 19, and a cooling storage 20. Each load port 17 functions as a placement stage for a FOUP 16 that is a container for accommodating the plurality of wafers W therein. The loader module 18 receives the accommodated wafers W from the FOUP 16 placed in each load port 17, or delivers the wafers W that have been subjected to the predetermined processes in the process module 13 to the FOUP 16. Each of the load-lock modules 19 temporarily holds the wafer and delivers the same between the loader module 18 and the transfer module 12. The cooling storage 20 cools down the wafer W that has been subjected to the heating process.

The loader module 18 is a rectangular housing whose interior is kept in an atmospheric atmosphere. The plurality of load ports 17 are arranged in a row along one of the long sides of the rectangle. Further, the loader module 18 includes a transfer arm (not shown) provided therein so as to move along the long sides of the rectangle. The transfer arm loads the wafer W from the FOUP 16 placed on each of the load ports 17 into the load-lock module 19, or unloads the wafer W from the load-lock module 19 to the respective FOUP 16.

Each of the load-lock modules 19 temporarily holds the wafers W to deliver the wafers W accommodated in the FOUP 16 placed on each load port 17 kept in an ambient atmosphere to the process modules 13 whose interior is kept in a vacuum atmosphere. Each of the load-lock modules 19 includes a buffer plate 21 configured to hold two sheets of wafers W. Further, each of the load-lock modules 19 includes a gate valve 22a for securing airtightness against the loader module 18 and a gate valve 22b for securing airtightness against the transfer module 12. Further, a gas introduction system and a gas exhaust system (both not shown) are coupled to each of the load-lock module 19 through respective pipes such that the interior of each of the load-lock modules 19 can be switched between the atmospheric atmosphere and the vacuum atmosphere.

The transfer module 12 loads an unprocessed wafer W from the loading/unloading part 11 into the process module 13, and unloads a processed wafer W from the respective process module 13 to the loading/unloading part 11. The transfer module 12 includes a rectangular housing whose interior is kept in a vacuum atmosphere. The transfer module 12 includes two transfer arms 14, a rotary base 23, a rotary mounting table 24, and guide rails 25. The transfer arms 14 hold and move two wafers W. The rotary base 23 supports the two transfer arms 14 in a rotatable manner. The rotary mounting table 24 mounts the rotary base 23 thereon. The guide rails 25 guide the rotary mounting table 24 to be movable in the longitudinal direction of the transfer module 12. The transfer module 12 is coupled to the load-lock modules 19 of the loading/unloading part 11 via the gate valves 22a and 22b and the process modules 13 via respective gate valves 26 to be described later. In the transfer module 12, the transfer arms 14 transfer two wafers W from the load-lock modules 19 to each process module 13. The transfer arms 14 unload two processed wafers W from the respective process module 13 to another process module 13 or the load-lock module 19.

In the processing system 10, each process module 13 executes any of the SiN film etching process and the heating process. That is, among the six process modules 13, a predetermined number of process modules 13 are used for the SiN film etching process, and the remaining process modules are used for the heating process to remove residues obtained after the etching of the SiN film. The number of the process modules 13 for the SiN film etching process and the number of process modules 13 for the heating process may be appropriately determined depending on each processing time.

The processing system 10 includes a control part 27. The control part 27 includes a main controller equipped with a CPU for controlling each component of the processing system 10, an input device (a keyboard, a mouse or the like), an output device (a printer or the like), a display device (a display or the like), and a storage device (a storage medium). The main controller of the control part 27 causes the processing system 10 to execute a predetermined operation based on, for example, a processing recipe stored in a storage medium built in the storage device or a storage medium set in the storage device.

<Etching Apparatus>

Figure 4:
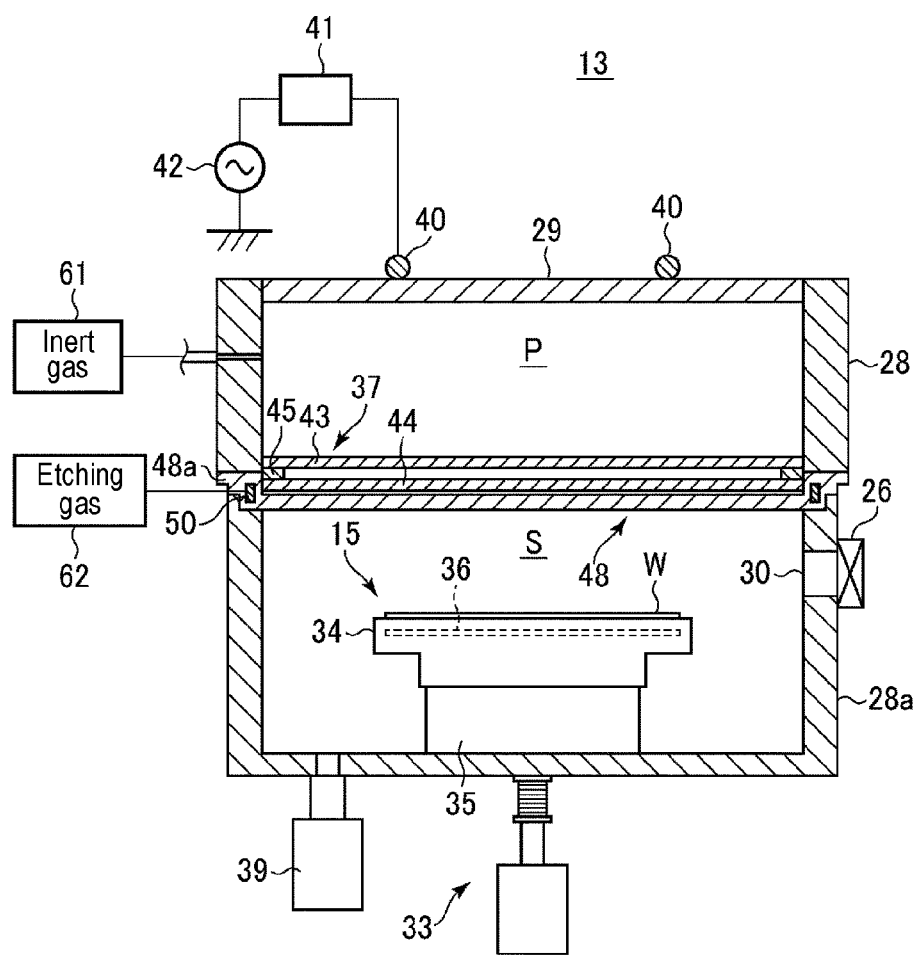
FIG. 4 is a cross-sectional view schematically illustrating an example of a SiN film etching apparatus installed in the processing system of FIG. 3 as a process module.

Next, an example of an etching apparatus that is mounted in the processing system 10, as the process module 13 that implements a SiN film etching method according to an embodiment, will be described. FIG. 4 is a cross-sectional view schematically illustrating an example of the SiN film etching apparatus among the process modules 13 in the processing system 10 of FIG. 3.

As illustrated in FIG. 4, the process module 13 as the etching apparatus that implements the SiN film etching process includes a hermetically-sealed processing container 28 that accommodates the wafer W. The processing container 28 is made of, for example, aluminum or an aluminum alloy. An upper end of the processing container 28 is opened and is closed with a lid 29 serving as a ceiling portion. A loading/unloading port 30 through which the wafer W is transferred is formed in a sidewall 28a of the processing chamber 28. The loading/unloading port 30 is opened and closed by the aforementioned gate valve 26.

As described above, the two stages 15 (only one of which is illustrated) for placing the respective wafers W thereon in a horizontal posture are disposed at a bottom portion inside the processing container 28. The stages 15 are moved upward and downward by a lifting mechanism 33. The stage 15 has a substantially cylindrical shape, and includes a placement plate 34 on which the wafer W is directly mounted, and a base block 35 that supports the placement plate 34. A temperature adjustment mechanism 36 for adjusting a temperature of the wafer W is provided inside the placement plate 34. For example, the temperature adjustment mechanism 36 has a pipe line (not illustrated) through which a temperature adjustment medium (e.g., water or Galden) circulates. The temperature of the wafer W is adjusted by exchanging heat between the temperature adjustment medium flowing through the pipe and the wafer W. The lifting mechanism 33 is disposed outside the processing container 28, and includes an actuator or the like that moves upward and downward the two stages 15 in a collective manner. The stage 15 is provided with a plurality of lifting pins (not illustrated) that are capable of being moved upward and downward on an upper surface of the placement plate 34, which are used in loading and unloading the wafer W into and from the processing container 28.

The interior of the processing container 28 is partitioned into a plasma production space P defined at the upper portion and a processing space S defined at the lower portion by a partition plate 37 (details thereof will be described later). The plasma production space P is a space in which plasma is produced, and the processing space S is a space in which an etching gas is adsorbed onto the wafer W and radical processing is performed. An inert gas source 61 that supplies an inert gas for plasma production (e.g., Ar gas) into the plasma production space P, and an etching gas source 62 that supplies an etching gas (e.g., HF gas) into the processing space S are provided outside the processing container 28. In addition to the etching gas, an inert gas such as an Ar gas or a $N_2$ gas, which functions as a dilution gas or the like, may be supplied from the etching gas source 62. An exhaust mechanism 39 is connected to the bottom portion of the processing container 28. The exhaust mechanism 39 includes a vacuum pump to exhaust the interior of the processing space S.

In addition, the etching apparatus provided as the process module 13 is configured as an inductively-coupled plasma etching apparatus using an RF antenna. The lid 29 serving as the ceiling portion of the processing container 28 may be formed of a circular quartz plate, and is configured as a dielectric window. An annular RF antenna 40 for generating an inductively-coupled plasma in the plasma production space P of the processing container 28 is provided on the lid 29. The RF antenna 40 is coupled to a high-frequency power supply 42 via a matcher 41. The high-frequency power supply 42 outputs high-frequency power having a predetermined frequency (e.g., 13.56 MHz or more) suitable for producing plasma through high-frequency discharge of inductive coupling, which corresponds to a predetermined output value. The matcher 41 includes a reactance-variable matching circuit (not shown) for taking an impedance matching between the high-frequency power supply 42 and a load (the RF antenna 40 or plasma).

Figure 5A:
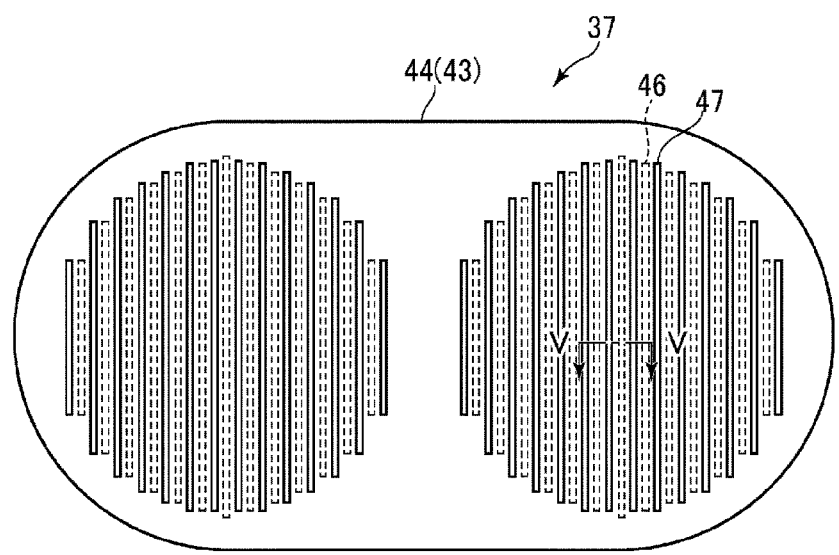
FIG. 5A is a view schematically illustrating the configuration of a partition plate in the etching apparatus of FIG. 4, which shows the partition plate as viewed from a processing space.
Figure 5B:
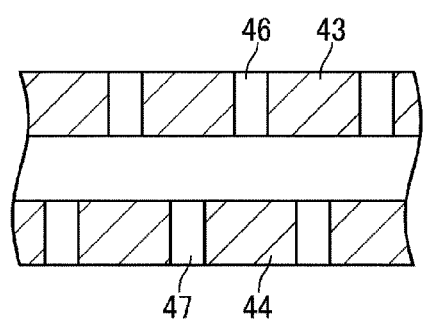
FIG. 5B is view schematically illustrating the configuration of the partition plate in the etching apparatus of FIG. 4, as a cross-sectional view taken along line V-V of FIG. 5A.

FIGS. 5A and 5B are views schematically illustrating the configuration of the partition plate 37 in FIG. 4. FIG. 5A is a view of the partition plate 37 as viewed from the side of the processing space of the substrate, and FIG. 5B is a cross-sectional view taken along line V-V of FIG. 5A.

As illustrated in FIGS. 5A and 5B, the partition plate 37 has at least two plate-shaped members 43 and 44. The plate-shaped member 43 and the plate-shape member 44 have a shape conforming to the horizontal cross-sectional shape of the processing container 28. In this example, the plate-shaped member 43 and the plate-shape member 44 have a substantially elliptical shape as illustrated in FIGS. 5A and 5B. The plate-shaped member 43 and the plate-shaped member 44 are disposed so as to overlap each other from the plasma production space P to the processing space S. A spacer 45 is disposed between the plate-shaped member 43 and the plate-shaped member 44 to maintain these members at a predetermined gap. A plurality of slits 46 and slits 47 penetrating in the overlapping direction are formed in the plate-shaped member 43 and the plate-shaped member 44, respectively. The plurality of slits 46 and the plurality of slits 47 are arranged in parallel. The plurality of slits 46 and the plurality of slits 47 are arranged so as not to overlap each other as viewed the partition plate 37 from the processing space S. The slits 46 and the slits 47 may be formed in a lattice shape. Even in this case, the slits 46 and the slits 47 are arranged so as not to overlap each other as viewed from the processing space S. In the plate-shaped member 43 and the plate-shaped member 44, a plurality of through-holes may be formed instead of the slits 46 and the slits 47, respectively. The plate-shaped member 43 and the plate-shaped member 44 are made of an insulator, for example, quartz glass.

The partition plate 37 functions as a so-called ion trap that suppresses transmission of ions in the plasma from the plasma production space P to the processing space S when the inductively-coupled plasma is produced in the plasma production space P. That is, as described above, a labyrinth structure is formed by arranging the slits 46 and the slits 47 so as not to overlap each other, and allows isotropically-moving radicals to pass through the partition plate 37 while blocking the movement of anistropically (linearly)-moving ions. The plasma production space P is formed as a remote plasma region. Only inert radicals, such as Ar radicals (Ar*), may be selectively transmitted into the processing space S through the partition plate 37, thereby reducing the possibility that ions exist in the processing space S. This makes it possible to reduce damage caused by ions colliding with the wafer W. In addition, the partition plate 37 is capable of preventing a top surface of the wafer W from being deteriorated by vacuum ultraviolet light by blocking the vacuum ultraviolet light emitted from the plasma.

A heat shield plate 48 is provided under the partition plate 37 to face the wafer W. Heat is accumulated in the partition plate 37 by repeating plasma production in the plasma production space P. The heat shield plate 48 is provided to suppress the heat from affecting the distribution of the radicals in the processing space S.

Figure 6A:
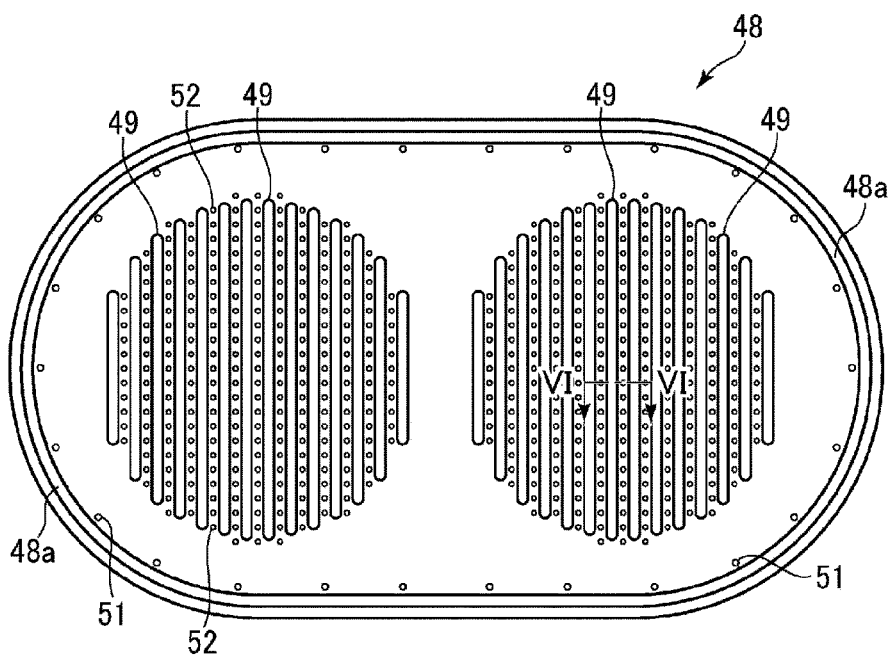
FIG. 6A is a view schematically illustrating the configuration of a heat shield plate in the etching apparatus of FIG. 4, which shows the heat shield plate as viewed from the processing space.
Figure 6B:
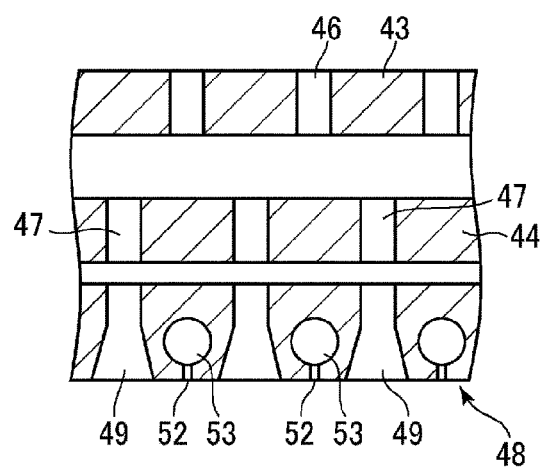
FIG. 6B is view schematically illustrating the configuration of the heat shield plate in the etching apparatus of FIG. 4, as a cross-sectional view taken along line VI-VI of FIG. 6A.

FIGS. 6A and 6B are views schematically illustrating the configuration of the heat shield plate in FIG. 4. FIG. 6A is a view of the heat shield plate 48 as viewed from the processing space S, and FIG. 6B is a cross-sectional view taken along line VI-VI in FIG. 6A. In FIG. 6B, a partition plate 37 is also drawn for ease of understanding.

As illustrated in FIGS. 6A and 6B, the heat shield plate 48 has a shape conforming to the horizontal cross-sectional shape of the processing container 28 like the plate-shaped member 43 and the plate-shaped member 44. In this example, the heat shield plate 48 has a substantially elliptic shape.

A plurality of slits 49 (radical passages) penetrating from the plasma production space P toward the processing space S are formed in the heat shield plate 48. Each slit 49 is formed so as to correspond to each slit 47 of the plate-shaped member 44. Each slit 49 has a cross-sectional shape which expands in diameter from the plasma production space P toward the processing space S. Instead of the slits 49, a plurality of through-holes, of which the diameter increases, may be formed.

The heat shield plate 48 is made of a metal having a high thermal conductivity, for example, aluminum or an aluminum alloy. The entire surface including a front surface of each slit 49 is covered with a dielectric, for example, a silicon compound or an yttrium compound. The heat shield plate 48 is formed to be larger than the plate-shaped member 44 of the partition plate 37. A flange portion 48a constituting the periphery of the heat shield plate 48 is embedded in the sidewall 28a of the processing container 28.

A large number of gas ejection ports 52 are formed between the slits 49 in the heat shield plate 48. The large number of gas ejection ports 52 are distributed so as to face the wafer W. The gas ejection ports 52 extend from gas passages 53 formed in the heat shield plate 48 to a lower surface of the heat shield plate 48. The gas passages 53 are connected to the etching gas source 62 via a pipe. The etching gas (e.g., HF gas) is uniformly ejected toward the processing space S from each gas ejection port 52, and is adsorbed onto the wafer W. That is, the heat shield plate 48 functions as a shower head for ejecting the etching gas.

The etching gas may be introduced directly into the processing space S from the sidewall 28a of the processing container 28. Such an etching gas introduction mode may be used in a case where the heat shield plate 48 is made of a hard-to-work material such as silicon. A cooling mechanism 50, for example, a coolant channel, a chiller, or a Peltier element, is embedded in the flange portion 48a.

A heating process apparatus that performs the heating process among the process modules 13, although not illustrated in detail, includes two stages 15 disposed in the processing container as in the etching apparatus that performs the SiN film etching process, as illustrated in FIG. 3. However, unlike the etching apparatus that performs the SiN film etching process, the heating process apparatus does not include a plasma production mechanism, and is configured to heat the wafers W placed on the stages 15 to a predetermined temperature by heaters provided inside the stages 15 while supplying an inert gas into the processing container. By heating the wafers W which have been subjected to the etching process, etching residues or reaction products existing on the wafers W are removed.

<SiN Film Etching Method>

Next, an example of the SiN film etching method according to this embodiment, which is performed using the processing system 10, will be described.

Figure 8:
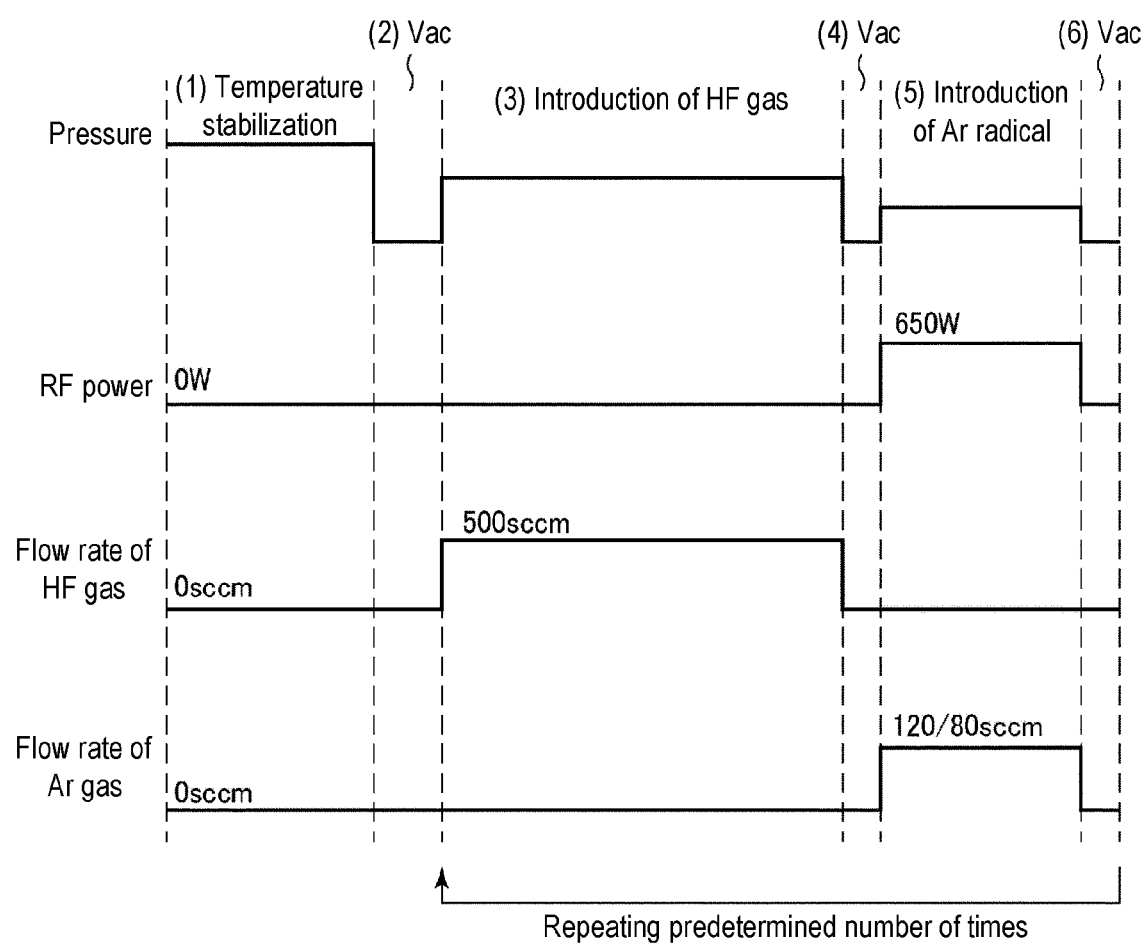
FIG. 8 is a timing chart illustrating the example of the SiN film etching method according to the embodiment of the present disclosure.

FIG. 7 is a flowchart illustrating the example of the SiN film etching method, and FIG. 8 is a timing chart thereof.

First, a wafer W having a SiN film formed thereon is loaded into an etching apparatus for etching the SiN film among the process modules 13 (in step 1). At this time, first, the wafer W having the SiN film formed thereon is taken out from the FOUP 16 by the transfer arm of the loader module 18, and is loaded into the load-lock module 19. Subsequently, the load-lock module 19 is evacuated, and then, the wafer W in the load-lock module 19 is loaded into the respective etching apparatus by the transfer arm 14 of the transfer module 12.

The SiN film to be etched is formed through thermal CVD, plasma CVD, ALD, or the like using a silane-based gas such as $SiH_4$, $SiH_2Cl_2$, or $Si_2Cl_6$ and a nitrogen-containing gas such as $NH_3$ gas or $N_2$ gas. H is contained in the SiN film.

Subsequently, an internal temperature of the processing container 28 is stabilized (in step S2; (1) temperature stabilization in FIG. 8). At this time, the inert gas such as a $N_2$ gas is introduced into the processing container 28 so that an internal pressure of the processing container 28. The wafer W is placed on the stage 15, of which the temperature is adjusted to a predetermined temperature by the temperature adjustment mechanism 36, and is held for a predetermined period of time. At this time, the inert gas is introduced into the processing container 28 so that the internal pressure of the processing container 28 is set to, for example, 2,000 mTorr (266 Pa). In addition, the holding time of the wafer W on the stage 15 is set to, for example, 30 sec. The wafer temperature may be set to −15 to 35 degrees C., for example, 15 degrees C. At this time, in order to increase the internal pressure of the processing container 28, a $N_2$ gas or the like is introduced into the processing container 28. A flow rate of the $N_2$ gas is about 500 to 1,500 sccm, for example, 750 sccm.

Next, the interior of the processing container 28 is vacuum-exhausted to purge the interior of the processing container 28 (in step S3; (2) vacuumization in FIG. 8). By the vacuumization, the gas in the processing container 28 may be purged easily in a short period of time. A period of time used at this time is, for example, 10 sec. The purging of the interior of the processing container 28 at this time may be performed by supplying an inert gas such as an Ar gas into the processing container 28 instead of the vacuumization. The vacuumization and the supply of the purge gas may be used in combination. When used in combination, the vacuumization and the supply of the purge gas may be performed either simultaneously or sequentially.

Subsequently, for example, a HF gas is introduced as the etching gas from the etching gas source 62 into the processing space S (in step S4; (3) HF gas introduction in FIG. 8). At this time, the internal pressure of the processing container 28 may be set to a low pressure of 10 to 1,500 mTorr (1.33 to 200 Pa), for example, 1,000 mTorr (133 Pa). Thus, the HF gas is adsorbed onto the SiN film formed on the front surface of the wafer W. A period of time at the adsorption may be 5 to 60 sec, for example, 60 sec. A flow rate of the HF gas as an etching gas may be 50 to 1,000 sccm, for example, 500 sccm. In addition to the etching gas, an inert gas such as an Ar gas or a $N_2$ gas may be supplied as a dilution gas.

Although the HF gas is illustrated as the etching gas, the etching gas is not limited to the HF gas but may be any gas containing H and F as long as H and F are adsorbed onto the SiN film. Examples of other gas containing H and F may include $C_xH_yF_z$-based gases, such as $CHF_3$, $CH_2F_2$ and $CH_3F$, and $SiH_xF_y$-based gases, such as $SiH_3F$, $SiH_2F_2$, and $SiHF_3$. Further, the gas containing H and F is not limited to a single gas, but two or more types of gases such as a H-containing gas and a F-containing gas, for example, a combination of $H_2$, $NH_3$, $H_2O$ and the like, and $F_2$, $ClF_3$, $CF_4$ and the like may be used. The etching gas is uniformly supplied from the etching gas source 62 toward the wafer W through the gas passages 53 and the gas ejection ports 52 in the heat shield plate 48. As described above, the etching gas may be introduced from the sidewall 28a of the processing container 28 into the processing space S.

Subsequently, the interior of the processing container 28 is vacuum-exhausted to purge the interior of the processing container 28, and the etching gas is discharged from the interior of the processing space S (in step S5; (4) vacuumization in FIG. 8). In this step, similarly to the purge in step 2, it is possible to easily purge the gas in the processing container 28 in a short period of time by the vacuumization. A period of time at the purge may be 5 to 30 sec, for example, 5 sec. The purge inside the processing container 28 at this time is similar to that in step S2, and may be performed by supplying a purge gas into the processing container 28 instead of the vacuumization. The vacuumization and the supply of the purge gas may be used in combination. When used in combination, the vacuumization and the supply of the purge gas may be performed either simultaneously or sequentially.

Subsequently, inert gas plasma, for example, Ar gas plasma, is generated in the plasma production space P, and only Ar radicals (Ar*) are selectively introduced into the processing space S (in step 6; (5) Ar radical introduction in FIG. 8). Thus, the Ar radicals are radiated onto the wafer W, so that an Ar radical process is performed. At this time, an inert gas, for example, an Ar gas, is introduced from the inert gas source 61 into the plasma production space P, and high-frequency power of a predetermined frequency is supplied from the high-frequency power supply 42 to the RF antenna 40, so that the inductively-coupled plasma is produced in the plasma production space P. The RF power at this time may be 350 to 1,000 W, for example, 650 W. The internal pressure of the processing container 28 may be set to a low pressure of 0.01 to 1 Torr (1.33 to 133 Pa), for example, 0.1 Torr (13.3 Pa).

The inductively-coupled plasma produced in the plasma production space P passes through the slits 46 and the slits 47 which form a labyrinth structure by being formed so as not to overlap each other in the plate-shaped member 43 and the plate-shaped member 44 constituting the partition plate 37. Then, while passing through the slits 46 and the slits 47, the movement of anisotropically (linearly)-moving ions is blocked and deactivated, and only isotropically-moving radicals are supplied into the processing space S. Thus, while reducing damage caused by ions colliding with the wafer W, only high energy and low damage inert gas radicals, for example, only the Ar radicals (Ar*), can be selectively introduced into the processing space S, so that the inert gas radicals are supplied (radiated) toward the wafer W.

Since the high-energy inert gas radicals, for example, the Ar radicals (Ar*), are supplied toward the wafer W as described above, energy equal to or higher than the activation energy $\Delta E_a$ of the etching reaction between the HF gas (a gas containing H and F) adsorbed onto the SiN film on the front surface of the wafer W and SiN is applied. Therefore, the etching reaction of the SiN film proceeds. A period of time in this step may be 5 to 60 sec, for example, 30 sec.

The inert gas used at this time is not limited to the Ar gas, and other inert gases such as a He gas, a Kr gas, a Ne gas, and a Xe gas may be used. A flow rate of the inert gas, for example, the Ar gas, is 50 to 1,000 sccm (e.g., 120 sccm) with respect to the plasma production space P. In addition, the inert gas may be supplied into the processing space S. In this case, the inert gas may be supplied at the flow rate of 50 to 1,000 sccm, for example, 80 sccm.

Subsequently, the interior of the processing container 28 is vacuum-exhausted to purge the interior of the processing container 28, so that the remaining gas is discharged from the interior of the processing space S (in step S7; (6) vacuumization in FIG. 8). In this step, similarly to the purge in step 2, it is possible to easily purge the gas in the processing container 28 in a short period of time by the vacuumization. A period of time at the purge may be 5 to 30 sec, for example, 5 sec. The purge inside the processing container 28 at this time is similar to that in step S2, and may be performed by supplying a purge gas into the processing container 28 instead of the vacuumization. The vacuumization and the supply of the purge gas may be used in combination. When used in combination, the vacuumization and the supply of the purge gas may be performed either simultaneously or sequentially.

The etching of the SiN film may be completed by a series of steps S1 to S7 described above, but may be completed after repeating the steps S4 to S7 a predetermined number of times (multiple times). By repeating these steps, it is possible to adjust an etched depth (amount) of the SiN film depending on the number of repetitions. In this embodiment, an etched amount of one round of etching is about 1.2 nm. Thus, for example, in order to etch the SiN film at the depth of 10 nm, it is necessary to repeat the above etching eight times.

The heating process may be performed one or more times during and/or after the above etching. This makes it possible to remove etching residues and reaction products. The heating process may be performed using a heating process apparatus provided as the process module 13. The heating process may be performed in an inert gas atmosphere at a pressure of about 1 to 3 Torr (133 to 400 Pa) and a temperature of 120 to 300 degrees C., for example, 190 degrees C.

The wafer W after etching is transferred to the load-lock module 19 by the transfer arm 14 built in the transfer module 12. The interior of the load-lock module 19 is kept in an atmospheric atmosphere, and then, the wafer W in the load-lock module 19 is returned to the FOUP 16 by the transfer arm of the loader module 18.

According to this embodiment, the gas containing H and F, such as the HF gas, is introduced into the processing space and is adsorbed onto the front surface of the SiN film. Subsequently the inert gas radicals are selectively introduced into the processing space and are radiated toward the wafer. Thus, energy higher than the activation energy of the etching reaction by the gas containing H and F on the SiN film is applied, thereby etching the SiN film. Then, by repeating these steps a predetermined number of times, it is possible to etch the SiN film by a desired depth (amount).

As described above, since the etching is performed with a gas system that does not contain an $O_2$ gas, there is no problem in which the surface oxidation of the SiN film is generated. In addition, since the etching is performed by radiating the inert gas radicals and applying energy higher than the activation energy of the etching reaction, the etching can be performed without using a high-pressure condition. In addition, in the case where the etching is performed using the gas containing H and F such as the HF gas, as the etching gas, the activation energy of the etching reaction of the SiN film is lower than that of other films coexisting with the SiN film, such as a $SiO_2$ film. Accordingly, it is possible to etch the SiN film with high selectivity relative to the other films.

In practice, a SiN film (DCS-SiN film) formed using DCS ($SiH_2Cl_2$) and a thermal oxide film were etched with a HF gas and Ar radicals (Ar*) at a wafer temperature of 15 degrees C. by the above-described method. As a result, an etched amount of the DCS-SiN film was 33.9 nm, and an etched amount of the thermal oxide film was 0.1 nm or less. That is, it was confirmed that the selectivity of the SiN film to the $SiO_2$ film was 100 or more.

Similarly, in the selectivity of the SiN film to a Si film, a SiGe film, a W film, a TiN film, or a TaN film, the selectivity was about 15 to 20 for the Si film and the SiGe film, about 5 to 20 for the W film, 100 or more for the TiN film and the TaN film.

From the above, according to this embodiment, it was confirmed that it is possible to etch the SiN film with high selectivity relative to the $SiO_2$ film, the Si film, the SiGe film, the W film, the TiN film, or the TaN film that may coexist with the SiN film.

<Other Applications>

It should be noted that the embodiments disclosed herein are exemplary in all respects and are not restrictive. The above-described embodiments may be omitted, replaced or modified in various forms without departing from the scope and spirit of the appended claims.

For example, in the above embodiments, the example has been described in which the processing container is partitioned by the partition plate, and the inert gas radicals in the plasma produced in the plasma production space defined at the upper portion are introduced into the processing space defined at the lower portion, so that the wafer is irradiated with the inert gas radicals. However, the present disclosure is not limited thereto. As an example, an apparatus that introduces inert gas radicals in plasma formed in a remote plasma region away from the processing space into the processing space via a waveguide, may be used.

While in the above embodiments, the inductively-coupled plasma has been described to be produced as plasma, the plasma may be a capacitively-coupled plasma or a microwave plasma.

EXPLANATION OF REFERENCE NUMERALS

13: process module (etching apparatus), 15: stage, 28: processing container, 37: partition plate, 39: exhaust mechanism, 40: RF antenna, 42: high-frequency power supply, 46, 47, 49: slit, 61: inert gas source, 62: etching gas source, P: plasma production space, S: processing space, W: wafer (target substrate)

What is claimed is:

1. A method of selectively etching a silicon nitride film, the method comprising:
   a first step of disposing a target substrate having the silicon nitride film formed thereon in a processing space;
   a second step of introducing a gas containing H and F into the processing space; and
   a third step of selectively etching the silicon nitride film by selectively introducing radicals of an inert gas into the processing space via a partition plate equipped with an ion trap mechanism including at least a first plate-shaped member in which a plurality of first slits are formed and a second plate-shaped member in which a plurality of second slits are formed, the plurality of first slits and the plurality of second slits being arranged not to overlap each other when the partition plate is viewed from the processing space,
   wherein an $O_2$ gas is not introduced into the processing space.

2. The method of claim 1, wherein the second step and the third step are repeated multiple times while the target substrate is being processed.

3. The method of claim 1, wherein the gas containing H and F is a HF gas.

4. The method of claim 1, wherein the processing space is defined by partitioning a processing container using the partition plate equipped with the ion trap mechanism, the processing space is formed below the partition plate, a plasma production space is formed above the partition plate, and the target substrate is disposed in the processing space,
   wherein the second step is performed by supplying the gas containing H and F into the processing space, and
   wherein the third step is performed by producing a plasma of the inert gas in the plasma production space, and introducing the radicals in the plasma into the processing space while trapping ions in the plasma by the ion trap mechanism.

5. The method of claim 1, wherein any of an Ar gas, a He gas, a Kr gas, a Ne gas, and a Xe gas is used as the inert gas to form the radicals.

6. The method of claim 1, wherein the second step and the third step are performed in a state where a temperature of the target substrate falls within a range of −15 to 35 degrees C.

7. The method of claim 1, wherein the second step is performed at a pressure ranging from 1.33 to 200 Pa.

8. The method of claim 1, wherein the third step is performed at a pressure ranging from 1.33 to 133 Pa.

9. The method of claim 1, wherein a heating process is performed one or more times while the second step and the third step are being repeated, and/or after each of the second step and the third step, to remove an etching residue and a reaction product.

10. The method of claim 1, wherein, in the target substrate, at least one selected from a group consisting of a $SiO_2$ film, a Si film, a SiGe film, a W film, a TiN film, and a TaN film, coexists with the silicon nitride film, and the silicon nitride film is selectively etched with respect to the coexisting film.

11. The method of claim 1, further comprising:
   a step of purging the processing space after each of the second step and the third step.

12. The method of claim 11, wherein the step of purging an interior of the processing space is performed by vacuum-exhausting the interior of the processing space.

13. The method of claim 11, wherein the step of purging an interior of the processing space is performed by introducing the inert gas into the processing space.

14. The method of claim 11, wherein the step of purging an interior of the processing space is performed by introducing the inert gas into the processing space and vacuum-exhausting an interior of the processing space.

15. An apparatus for selectively etching a silicon nitride film, comprising:
- a processing container configured to accommodate a target substrate having the silicon nitride film formed thereon, at least during selective etching of the silicon nitride film;
- a partition plate configured to partition the processing container into a plasma production space defined at an upper portion and a processing space defined at a lower portion;
- an ion trap mechanism provided in the partition plate and including at least a first plate-shaped member in which a plurality of first slits are formed and a second plate-shaped member in which a plurality of second slits are formed, the ion trap mechanism being configured to trap ions and allow radicals to pass therethrough, the plurality of first slits and the plurality of second slits being arranged not to overlap each other when the partition plate is viewed from the processing space;
- a first gas source configured to supply an inert gas to the plasma production space;
- a plasma production mechanism configured to produce a plasma of the inert gas in the plasma production space;
- a placement stage provided in the processing space to place the target substrate thereon;
- a second gas source configured to supply a gas containing H and F into the processing space;
- an exhaust mechanism configured to vacuum-exhaust an interior of the processing container; and
- a controller configured to perform a control to execute:
  - a first step of disposing the target substrate having the silicon nitride film formed thereon in the processing space;
  - a second step of introducing the gas containing H and F into the processing space; and
  - a third step of selectively etching the silicon nitride film by producing the plasma in the plasma production space and introducing the radicals in the plasma into the processing space via the partition plate while trapping the ions in the plasma by the ion trap mechanism,
- wherein an $O_2$ gas is not introduced into the processing space.

16. The apparatus of claim 15, wherein the controller performs the control to repeat multiple times, the second step and the third step while the target substrate is being processed.

17. The apparatus of claim 15, wherein the gas containing the H and F is an HF gas.

18. The apparatus of claim 15, further comprising:
- a heat shield plate provided below the partition plate,
- wherein the gas containing H and F is introduced into the processing space through the heat shield plate.

19. A method of selectively etching a silicon nitride film, the method comprising:
- a first step of disposing a target substrate having the silicon nitride film formed thereon in a processing space;
- a second step of introducing a gas containing H and F from an etching gas source directly into the processing space; and
- a third step of selectively introducing radicals of an inert gas generated in a plasma production space into the processing space,
- wherein the gas containing H and F is a HF gas,
- wherein the second step and the third step are performed in a state where a temperature of the target substrate falls within a range of −15 to 35 degrees C., and
- wherein an $O_2$ gas is not introduced into the processing space.

* * * * *